US006531883B2

(12) United States Patent

Hayashi

(10) Patent No.: US 6,531,883 B2
(45) Date of Patent: Mar. 11, 2003

(54) THERMAL PRINTER AND DEVICE AND METHOD FOR MEASURING RESISTANCE OF HEATING ELEMENT OF THERMAL HEAD OF THERMAL PRINTER

(75) Inventor: Junji Hayashi, Saitama (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 60 days.

(21) Appl. No.: 09/729,802

(22) Filed: Dec. 6, 2000

(65) Prior Publication Data

US 2001/0000671 A1 May 3, 2001

(30) Foreign Application Priority Data

Jul. 12, 1999 (JP) ........................................... 11-348212
Jul. 12, 1999 (JP) ........................................... 11-348213

(51) Int. Cl.[7] ............................ G01R 27/26; B41J 2/35
(52) U.S. Cl. ........................ 324/678; 324/711; 347/175
(58) Field of Search ................................ 324/678, 676, 324/677, 679, 691, 710, 711, 703; 347/212, 175

(56) References Cited

U.S. PATENT DOCUMENTS 4,734,704 A 3/1988 Mizutani et al.
5,469,068 A 11/1995 Katsuma .................... 324/678
5,608,333 A 3/1997 Hayashi ...................... 324/711
5,852,369 A 12/1998 Katsuma .................... 324/678
6,204,671 B1 * 3/2001 Katsuma .................... 324/678

* cited by examiner

*Primary Examiner*—N. Le
*Assistant Examiner*—James Kerveros
(74) *Attorney, Agent, or Firm*—Sughrue Mion, PLLC

(57) ABSTRACT

A thermal head of a thermal printer is provided with an array of parallel connected heating elements and transistors connected in series to the heating elements in one to one relation. In a resistance measuring mode, one of the transistors connected to one heating element whose resistance is to measure is turned on, and other transistors are turned off. In this condition, a capacitor connected in parallel to the heating element is charged up to a predetermined voltage, and then discharged. A counter circuit starts time-counting by a short unit time t0 when a predetermined delay time T min has passed since the start of discharging, and outputs a count Q when the charged voltage goes down to a predetermined level. Based on a discharge time T=T min+t0·Q, the resistance of the heating element is calculated.

20 Claims, 8 Drawing Sheets

THERMAL PRINTER AND DEVICE AND METHOD FOR MEASURING RESISTANCE OF HEATING ELEMENT OF THERMAL HEAD OF THERMAL PRINTER

BACKGROUND OF THE INVENTION

1. Field of the Invention

The present invention relates to a thermal printer that forms an image by a thermal head having a plurality of heating elements, and more particularly to a device and a method for measuring resistance of the heating elements, for modifying image data so as to compensate for variations in resistance between the heating elements.

2. Background Arts

As well known, thermal printers may be classified into thermal transfer printers and thermosensitive type printers. The thermal transfer printers use an ink film and transfers ink from the ink film onto a paper by heating the ink film. The thermosensitive type printers heat a thermosensitive recording medium directly to record an image thereon. To heat the ink film or the thermosensitive recording medium, the thermal printer use a thermal head with a linearly arranged array of large number of heating elements. The heating elements are constituted of resistors connected in parallel to one another.

U.S. Pat. No. 4,734,704 (corresponding to JPA No. 61-213169) discloses a color thermosensitive printer that uses a thermosensitive color recording medium. The color thermosensitive recording medium has a cyan thermosensitive coloring layer, a magenta thermosensitive coloring layer, and a yellow thermosensitive coloring layer, which are formed atop another in this order from a base material. These thermosensitive coloring layers, hereinafter called simply as the coloring layers, have different heat sensitivities that become lower as the distance from the outside surface increases. Thus, the deeper the coloring layer, the higher coloring heat energy is required. Furthermore, the coloring layers may be optically fixed, each by electromagnetic rays of a specific wavelength range. Therefore, recording of a full-color image on the thermosensitive color recording medium is performed in the order from the top or outermost coloring layer to the inner coloring layer, while optically fixing the just recording coloring layer prior to recording the next coloring layer, so as to avoid double-recording.

Each heating element applies a different coloring heat energy to the thermosensitive color recording medium in accordance with a characteristic curve of each coloring layer, to form a color dot at a different density. As the coloring heat energy, first a bias heat energy is applied for heating the thermosensitive color recording medium up to a temperature above which a particular color begins to be developed. Next, a gradation heat energy is applied for developing the particular color at a designated density. The bias heat energy is a constant value determined for each color according to the heat sensitivity or characteristic curve of the individual coloring layer. Generally, the heating element is activated for several ms to several tens of ms (milliseconds) to apply the bias heat energy. On the other hand, in order to reproduce fine gradation, the gradation heat energy needs to be controlled with more accuracy, so activation time or power conduction time is controlled by several $\mu$s (micro seconds) to several tens of $\mu$s after applying the bias heating energy.

In spite of such a fine control of heating or conduction time of the heating elements, the consequent image cannot exactly reproduce the desired fine gradation unless all the heating elements of the same thermal head have a completely uniform resistance. This is because the heating elements generate different heat energies if they have different resistances, even while they are driven for the same time. However, the heating elements generally have variations of about 5% to 10% in resistance. Moreover, the resistance of each heating element varies with age and its recording history. For this reason, the printed images tend to have imperfections, such as chromatic unevenness.

In order to eliminate such undesirable phenomena, U.S. Pat. No. 5,469,068 (corresponding to JPA No. 6-79897) proposes a color thermosensitive printer that measures resistances of the respective heating elements, and modify image data based on the measured resistances so as to compensate for the variations in resistance. In this prior art, a capacitor with a known capacitance is fully charged and, thereafter, discharged through each individual heating element, while counting the time required to discharge the capacitor down to a constant voltage level, e.g. a half of a power source voltage. Since the discharge time is proportional to the resistance of the heating element, the resistance of each individual heating element is obtained based on the discharge time and the known capacitance.

Concretely, the resistance R of one heating element is calculated according to the following equations, assuming that it takes a discharge time T for discharging of the capacitor having a capacitance C from a predetermined discharge start voltage E to a predetermined discharge stop voltage Vref through the heating element. In the above prior art, Vref=E/2.

$$Vref/E = \exp\{-T/(C \cdot R)\} \tag{1}$$

$$R = -T/C/\ln(Vref/E) \tag{2}$$

If the capacitance C is a known value, it is possible to calculate the resistance R by measuring the discharge time T. Even where the capacitance C is an unknown value, it is possible to calculate the resistance R according to the following equations, by measuring a discharge time Ts required to discharge the capacitor through a reference resistor whose resistance Rs is known.

$$R = Rs \cdot T/Ts \tag{3}$$

$$T = -C \cdot R \cdot \ln(Vref/E) \tag{4}$$

As a device for measuring the discharge time, a counter circuit or a timer of a microcomputer is used. The counter circuit counts by a predetermined unit time to output a count corresponding to the discharge time. The microcomputer calculates the discharge time by multiplying the unit time by the obtained count. For the sake of accuracy, it is desirable to predetermine the unit time as short as possible. However, with a sufficiently short unit time, the counter circuit is required to count up to a large value where the discharge time to measure is relatively long. That is, an expensive counter circuit with a large bit number is needed. With an inexpensive counter circuit that has a small counter number, the unit time has to be so long that it is hard to achieve sufficiently accurate measurement of the discharge time.

Furthermore, not only the resistance R of the heating elements, but also the above discharge start voltage E, the discharge stop voltage Vref and the capacitance C of the capacitor have variations respectively. For instance, the variation in the discharge start voltage E is ±2% when E=20V, variation in the reference voltage is ±2% when Vref=19V, the variation in capacitance C is ±20%, and the variation in resistance R is ±1%. If these values are applied to the above equation (2), the discharge time T would have a variation of about +116%~−83%. On the other hand, in order to save time for the resistance measurement, it is desirable to set the discharge stop voltage Vref to be closer to the discharge start voltage E. However, as the ratio of the discharge start voltage E to the discharge stop voltage Vref approaches "1", the variation in the discharge time T comes to be very large, because being affected by a natural logarithm in the equation (4). Also for this reason, it is necessary to set the unit time to be long enough for preventing overflowing of the counter circuit, in order to use an inexpensive counter circuit with a small bit number.

SUMMARY OF THE INVENTION

In view of the foregoing, an object of the present invention is to provide a device and a method for measuring resistances of heating elements of a thermal head of a thermal printer, that make it possible to measure the discharge time with accuracy and thus calculate the resistance of the heating element with accuracy based on the discharge time, without the need for an expensive counter circuit having a large bit number.

Another object of the present invention is to provide device and a method for measuring resistances of heating elements of a thermal head of a thermal printer, that eliminate influence of variations in the set voltages and save time for the measurement while maintaining resolution of a counter circuit that measures the discharge time.

According to the present invention, a method for measuring resistance of each individual of parallel connected heating elements of a thermal head comprises the steps of:

- charging a capacitor up to a first voltage level, the capacitor being connected in parallel with the heating elements;
- discharging the capacitor from the first voltage level to a second voltage level through one the heating element whose resistance is to be measured;
- starting counting discharge time after a predetermined delay time from the start of discharging the capacitor through the one heating element;
- calculating a discharge time of the capacitor from the first voltage level to the second voltage level based on the delay time and a count obtained by the counting; and
- calculating a resistance value of the one heating element based on the calculated discharge time.

Starting counting the discharge time after the predetermined delay time makes it possible to count a remaining period of the discharge time by a small unit time and thus with a sufficient accuracy, without the need for an expensive counter with a large bit number.

The delay time is preferably equal to or slightly less than a shortest discharge time required to discharge the capacitor from the first voltage level to the second voltage level through one heating element having a smallest resistance among the heating elements. Since the delay time is predetermined, it is possible to clock the delay time at a longer interval than a unit time of the counting.

According to another aspect of the present invention, a method for measuring resistance of each individual heating elements of a thermal head by measuring discharge time of a capacitor through each of the heating elements, the heating elements and the capacitor being connected in parallel to one another, comprises the steps of:

- measuring a first reference discharge time of the capacitor from a first discharge start voltage to a discharge stop voltage through a reference resistor having a known resistance, by counting with a counter;
- judging whether the first reference discharge time satisfies a condition that is determined based on a bit number and a unit time of the counter;
- determining, if the first reference discharge time satisfies the condition, a second discharge start voltage that is higher than the first discharge start voltage by a degree that the counter would not overflow;
- measuring discharge time of the capacitor from the second discharge start voltage to the discharge stop voltage sequentially through the reference resistor and each of the heating elements;
- measuring, if the first reference discharge time does not satisfy the condition, discharge time of the capacitor from the first discharge start voltage to the discharge stop voltage sequentially through each of the heating elements; and
- calculating respective resistance values of the heating elements based on the measured discharge times through the reference resistor and each of the heating elements.

Since the discharge time is first measured from the predetermined lower discharge start voltage, and is compared to the condition determined by the bit number and the unit time of the counter, it comes to be possible to determine a discharge start voltage for the resistance measurement, while taking account of variations or setup tolerances in the discharge start voltage, the discharge stop voltage, capacitance of the capacitor, and resistance of the reference resistor. Therefore, this configuration is effective to measure the resistance in a short time, while making good use of the capacity of the counter and preventing the counter from overflowing.

According to the present invention, a resistance measuring device for a thermal head having an array of parallel connected heating elements which are heated by a voltage supplied from a power supply section, and transistors connected in series to the heating elements in one to one relation comprises:

- a capacitor connected to the power supply circuit in parallel with the heating elements;
- a switch connected between the power supply section and the capacitor to connect or disconnect the capacitor and the heating elements to or from the power supply section;
- a control device for turning the switch ON to charge the capacitor up to a first voltage level, and then turning the switch OFF to discharge the capacitor through one of the heating elements while setting a corresponding one of the transistors ON;
- a delay circuit that starts clocking a predetermined delay time with the start of discharging the capacitor;
- a counter that starts time-counting when the delay circuit finishes clocking the delay time, and stops counting when voltage charged in the capacitor reaches a second voltage level, the counter counting by a unit time that is shorter than a clock interval of the delay circuit; and
- a calculation device for calculating a resistance value of the one heating element based on a discharge time determined by adding the delay time to a time obtained by multiplying the unit time by a count of the counter.

According to another aspect of the present invention, a resistance measuring device for a thermal head having an array of parallel connected heating elements which are heated by a voltage supplied from a power supply section, and transistors connected in series to the heating elements in one to one relation comprises:

a capacitor connected to the power supply circuit in parallel with the heating elements;

a reference resistor having a known resistance and being connected in parallel to the heating elements;

a transistor connected in series to the reference resistor;

a switch connected between the power supply section and the capacitor to connect or disconnect the capacitor and the heating elements to or from the power supply section;

a control device for turning the switch ON to charge the capacitor and then turning the switch OFF to discharge the capacitor through one of the heating elements and the reference resistor while setting a corresponding one of the transistors ON;

a counter for measuring discharge time of the capacitor from the start of discharging till charged voltage in the capacitor reaches a predetermined discharge stop voltage;

a judging device for judging whether a first reference discharge time is less than a comparative value that is determined based on a bit number and a unit time of the counter, the first reference discharge time being measured by discharging the capacitor through the reference resistor from a predetermined first discharge start voltage to the discharge stop voltage;

a discharge start voltage determining device for determining a second discharge start voltage based on the first reference discharge time and the first discharge start voltage if the first reference discharge time is less than the comparative value; and a calculation device for calculating a resistance value of the one heating element on the basis of discharge times measured relating to the reference resistor and the one heating element from the second discharge start voltage after the second discharge start voltage is determined, or on the basis of the first reference discharge time and a discharge time measured relating to the one heating element from the first discharge start voltage if the first reference discharge time is not less than the comparative value.

BRIEF DESCRIPTION OF THE DRAWINGS

The above and other objects and advantages of the present invention will become apparent from the following detailed description of the preferred embodiments when read in association with the accompanying drawings, which are given by way of illustration only and thus are not limiting the present invention. In the drawings, like reference numerals designate like or corresponding parts throughout the several views, and wherein.

DETAILED DESCRIPTION OF THE EMBODIMENTS

Figure 1:
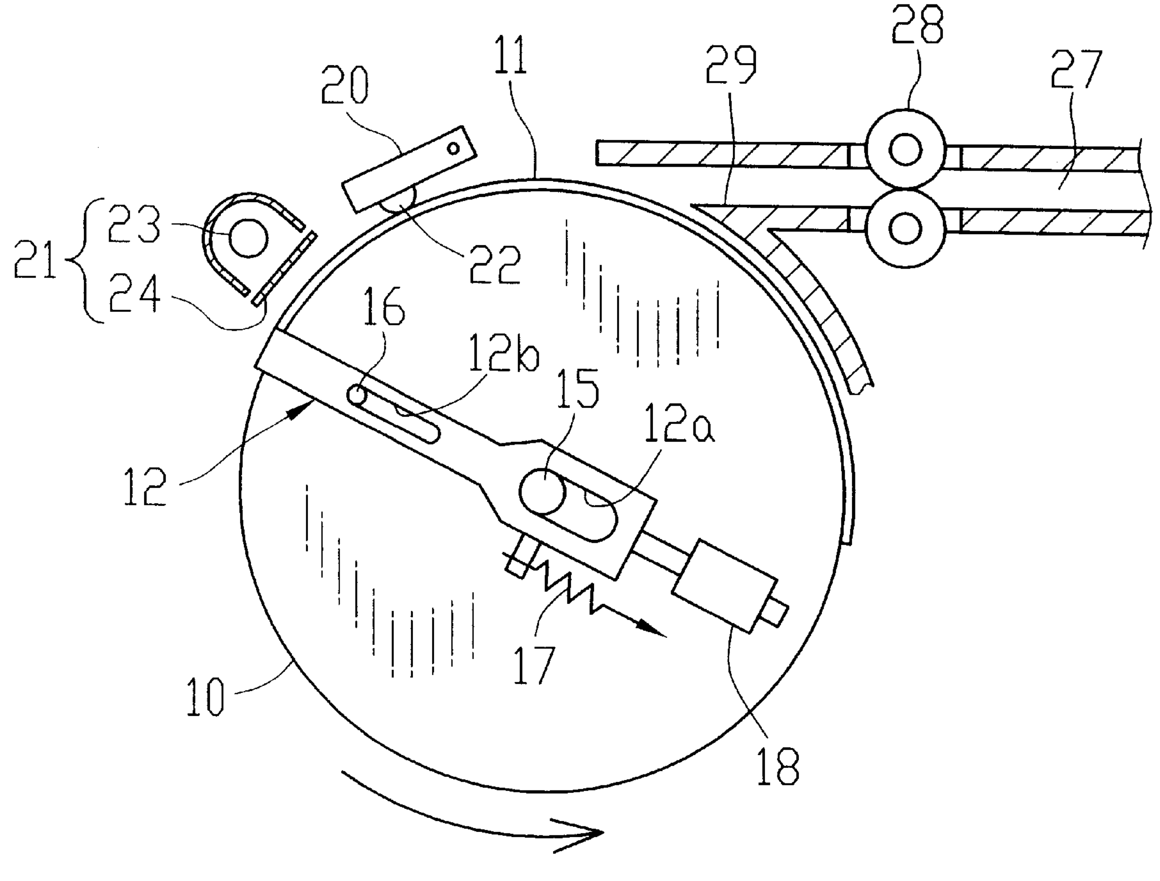
FIG. 1 is a schematic diagram illustrating a thermosensitive color printer according to an embodiment of the present invention.

In FIG. 1 showing a thermosensitive color printer, a platen drum 10 carries a thermosensitive color recording paper 11 on the outer periphery thereof, and is rotated by a pulse motor (not shown) in a direction of an arrow during thermal recording. The platen drum 10 is provided with a clamp member 12 which secures the thermosensitive color recording paper 11 to the platen drum 10 at least at a portion, for example, at the leading end of the thermosensitive color recording paper 11. The clamp member 12 is of a channel shape having a clamp portion extending in an axial direction of the platen drum 10. Slots **12*a* and 12*b* are formed in either arm portion. The slots 12*a* are engaged with opposite ends of a drum shaft 15, and the slots 12*b* are engaged with guide pins 16 provided on both sides of the platen drum 10. The clamp portion of the clamp member 12 is usually pressed onto the platen drum 10 by a spring 17, and is removed off the platen drum 10 an act of a solenoid 18 when the thermosensitive color recording paper 11 is to be placed on or displaced from the platen drum 10**.

Above the outer periphery of the platen drum 10, a thermal head 20 and an optical fixing device 21 are disposed. The thermal head 20 has a heating element array 22 which radiates constant bias heat energy and gradation heat energy that is variable depending upon recording density of each pixel. The optical fixing device 21 includes a stick-shaped ultraviolet lamp 23 and a sharp cut filter 24 movable in front of the ultraviolet lamp 23.

Figure 2:
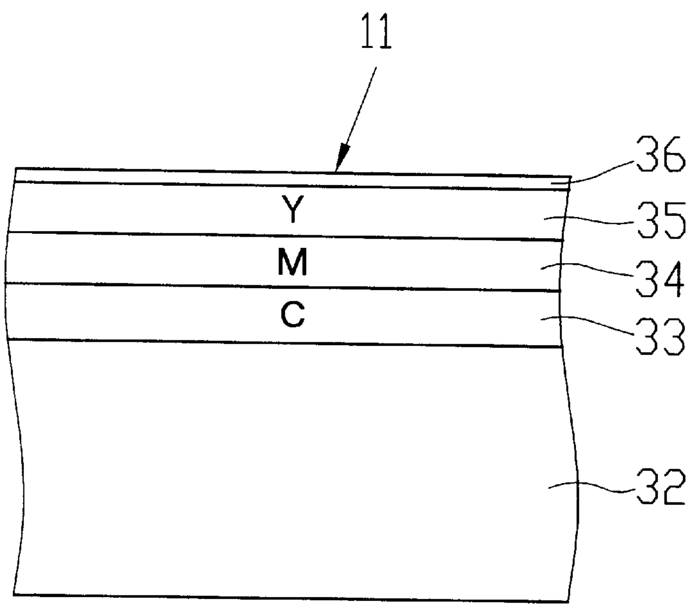
FIG. 2 is an explanatory diagram illustrating a thermosensitive color recording paper.

FIG. 2 shows an example of the thermosensitive color recording paper 11, wherein a cyan thermosensitive coloring layer 33, a magenta thermosensitive coloring layer 34 and a yellow thermosensitive coloring layer 35 are formed atop another in this order from a base material 32. Hereinafter, these thermosensitive coloring layers 33 to 35 will be referred to simply as the cyan, magenta and yellow coloring layers 33 to 35 respectively. A protection layer 36 is formed on the topmost yellow thermosensitive coloring layer 35. The base material 32 is an opaque coated paper or plastic film, or a transparent plastic film.

The cyan coloring layer 33 contains an electron donating dye precursor and an electron accepting compound as main components, and is colored cyan when a predetermined amount of heat energy per unit area is applied thereto. The magenta recording layer 34 contains a diazonium salt compound having a maximum absorption factor at a wavelength of about 365 nm and a coupler which acts upon the diazonium salt compound and is developed in magenta when it is heated. The magenta coloring layer 34 loses its ability of developing color when it is exposed to electromagnetic rays of about 365 nm, i.e. ultraviolet rays, because the diazonium salt compound is photochemically decomposed by this range of rays. The yellow recording layer 35 contains a diazonium salt compound having a maximum absorption factor at a wavelength of about 420 nm and a coupler which acts upon the diazonium salt compound and is developed in yellow when it is heated. The yellow coloring layer 35 loses its ability of developing color when it is exposed to electromagnetic rays of about 420 nm, i.e. near ultraviolet rays, because the diazonium salt compound in the yellow coloring layer 35 is photochemically decomposed by this range of rays.

Figure 3:
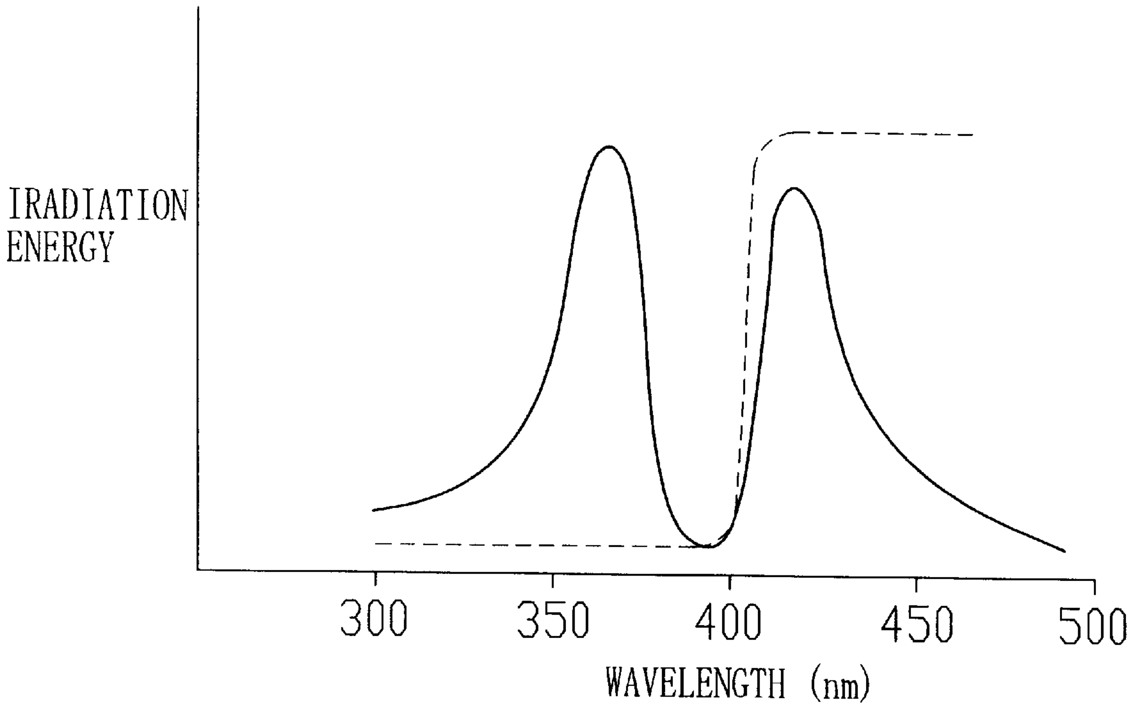
FIG. 3 is a graph illustrating characteristic curves of an ultraviolet lamp and a sharp-cut filter of an optical fixing device of the thermosensitive color printer.

In correspondence with the properties of the thermosensitive color recording paper 11, the ultraviolet lamp 23 of the optical fixing device 21 has two emission centers at wavelengths of 365 nm and 420 nm, as shown by solid line curve in FIG. 3, and the sharp-cut flter 24 has a transmission curve as shown by dashed line in FIG. 3. The sharp-cut filter 24 is placed on the front of the ultraviolet lamp 23 by means of a solenoid or another device, so as to transmit merely the near ultraviolet rays having a wavelength range about 420 nm when fixing the yellow recording layer 35.

The thermosensitive color recording paper 11 is fed to the platen drum 10 through a paper passageway 27 by means of a pair of feed rollers 28. After printing, the thermosensitive color recording paper 11 is ejected from the platen drum 10 through the paper passageway 27. In the vicinity of the paper passageway 27, a peeling member 29 is provided for peeling off the trailing end of the thermosensitive color recording paper 11 from the platen drum 10 and guiding the thermosensitive color recording paper 11 to the paper passageway 27 to eject the thermosensitive color recording-paper 11. Although the paper passageway 27 is commonly used for paper feeding and ejecting, it is possible to provide a paper ejection path separately from a paper feed path.

Figure 4:
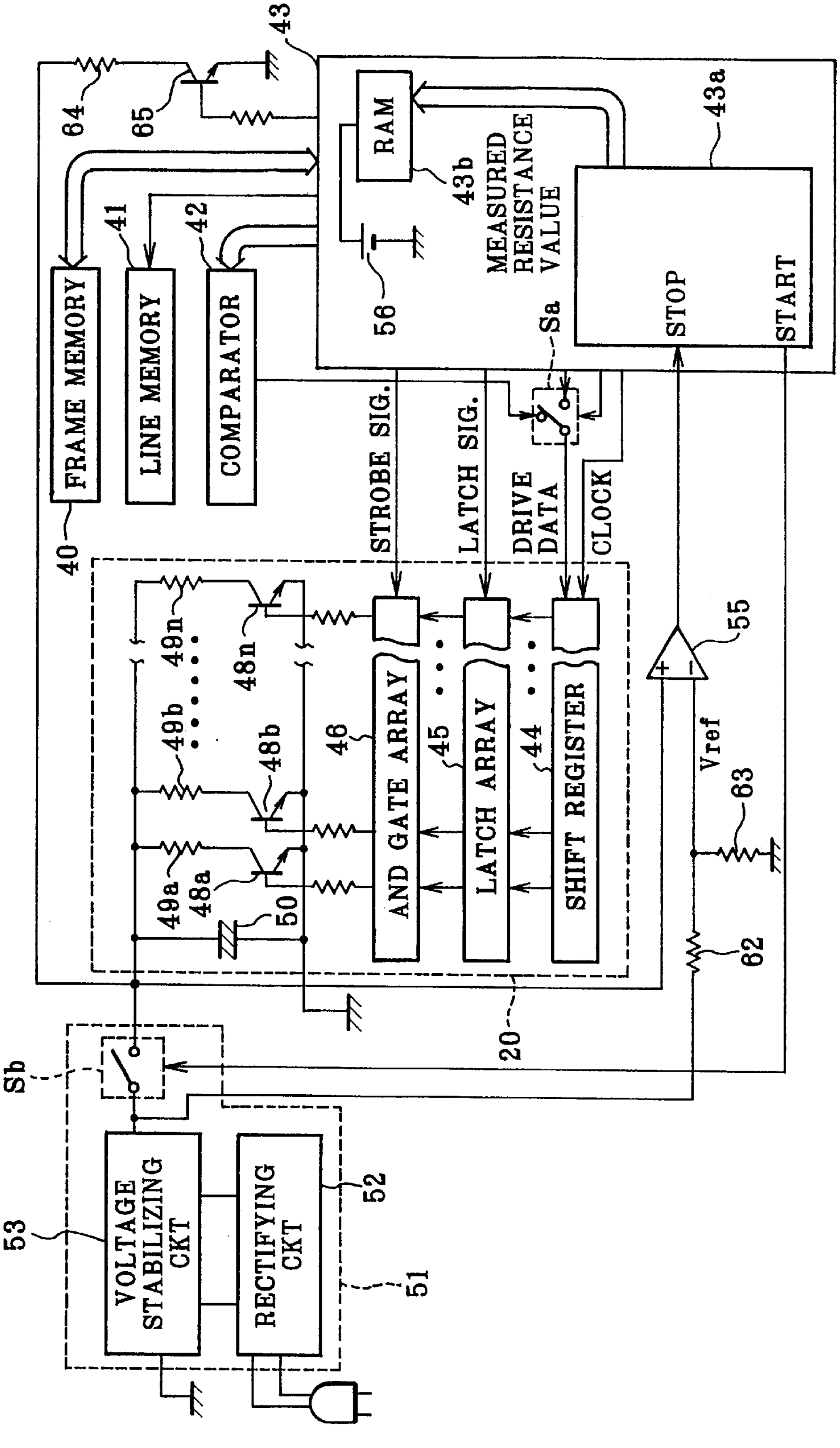
FIG. 4 is a block diagram of the thermosensitive color printer.

FIG. 4 shows an embodiment of the circuitry of the thermosensitive color printer. A frame memory 40 stores color image data of one frame separately for each color. In thermal recording, the image data of one line is read out for each color and line by line from the frame memory 40, and is written in a line memory 41. The image data of one line is read out from the line memory 41, and is serially sent to a comparator circuit 42. The comparator 42 compares the image data of each pixel with gradation data that represents reference values for respective tonal levels, and outputs a high level signal "H" when the image data is larger than the compared gradation data.

The gradation data is generated time-sequentially by a microcomputer 43 in the order from the lowest tonal level "0". For instance, where the gradation represented by the image data is constituted of 64 tonal levels, the gradation data "0" to "3F" in the hexadecimal notation are generated. First, the comparator 42 compares the image data of each pixel of one line with the first gradation data "0", and serially outputs the results of the comparison to a shift register 44 of the thermal head 20 through a first switch Sa. Then, the microcomputer 43 generates the second gradation data "1" to the comparator 42, so the comparator 42 compares the image data of each pixel of the same line with the second gradation data and serially outputs the results of the comparison to the shift resister 44. In this way, the image data of each pixel is compared 64 times with the gradation data "0" to "64", so as to be converted into 64-bit drive data for each pixel. The 64-bit drive data of each pixel of one line is sent to the shift register 44 by transferring the serial signals 64 times from the comparator 42 to the shift register 44.

The serial drive data is shifted in the shift register 4 at the timing of a clock signal, so as to be converted into a parallel form. The parallel drive data is latched in a latch array 45 in synchronism with a latch signal. The latch array 45 includes a number of elements corresponding to the number "n" of the pixels that constitute one line (n=an integer). The parallel outputs of the latch array 45 are connected to an AND gate array 46 consisting of the corresponding number "n" of AND gates. The AND gate array 46 receives a strobe signal. If the one bit of the 64-bit drive data that is just applied to a first input of one AND gate is high when the strobe signal is applied to a second input of that AND gate, the AND gate outputs a high level signal "H".

The parallel outputs of the AND gate array 46 are connected to transistors **48*a* to 48*n*, in one to one relation, each of which is turned ON when the allocated output of the AND gate array 46 takes the high level "H". The transistors 48*a* to 48*n* are connected in series to the plurality of resistors 49*a* to 49*n* in one to one relation. These resistors 49*a* to 49*n* constitute heating elements of the heating element array 22 of the thermal head 20**.

A reference resistor 64 and a transistor 65 are connected in parallel to these circuits of the heating elements **49*a* to 49*n* and the transistors 48*a* to 48*n*. The reference resistor 64** has a known resistance Rs whose variation is within 1% or so.

A capacitor 50 is connected in parallel to the heating elements **49*a* to 49*n*, which is used for the resistance measurement and the noise absorption. A power supply section 51 is connected to the heating elements 49*a* to 49*n* through this capacitor 50. The power supply section 51 is constituted of a second switch Sb, a regulating circuit 52 and a voltage stabilizing circuit 53. The second switch Sb is maintained closed or in an ON position in a print mode. In a resistance measuring mode, the second switch Sb is turned OFF and ON under the control of the microcomputer 43, to measure resistances Ra to Rn of the heating elements 49*a* to 49*n*** in turns. The first switch Sa is used for switching the printer between the print mode and the resistance measuring mode.

A first terminal of the capacitor 50 is connected to a non-inverting input of a comparator 55 whose reference voltage Vref is tapped from the voltage stabilizing circuit 53 by dividing a power source voltage through resistors 62 and 63 with resistances of R1 and R2 respectively. In this embodiment, the capacitor 50 starts being discharged after it is fully charged, for the sake of measuring resistance of each heating element. Accordingly, the power source voltage is equal to a discharge start voltage E, and Vref=E{R1/(R1+R2)}.

Figure 5:
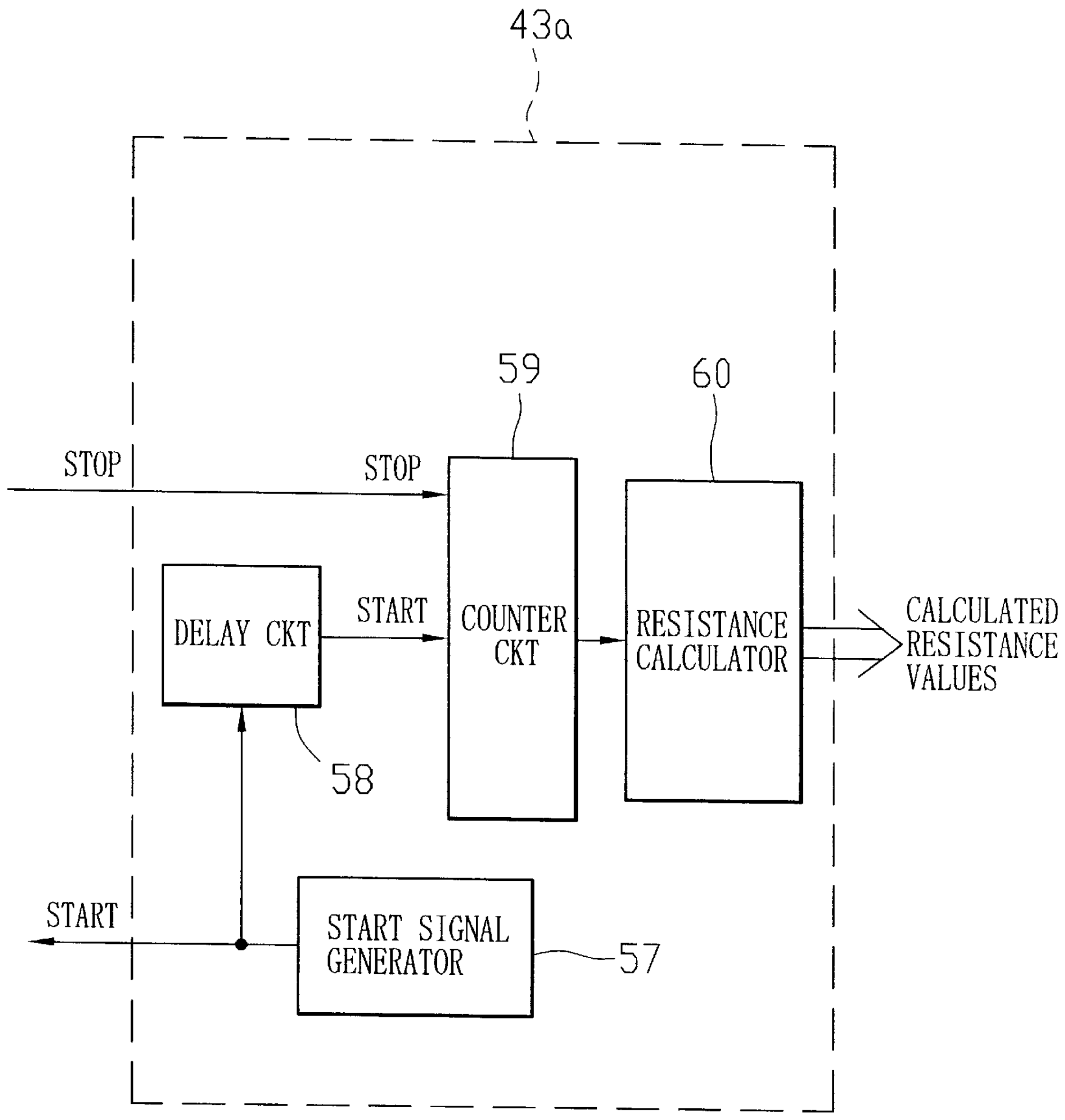
FIG. 5 is a block diagram of a resistance measuring section of the thermosensitive color printer.

The microcomputer 43 includes a resistance measuring section **43*a* that is constituted of a start signal generator 57, a delay circuit 58, a counter circuit 59 and a resistance calculator 60, as shown in FIG. 5. The start signal generator 57 turns on the second switch Sb to charge the capacitor 50 in the resistance measuring mode, and turns off the second switch Sb when the voltage at the non-inverting input of the comparator 55 comes to be equal to the power source voltage E, i.e. when the capacitor 50 is charge up to the full. Simultaneously with the second switch Sb being turned off, the start signal generator 57 outputs a start signal to the delay circuit 58**.

The delay circuit 58 starts clocking a delay time upon receipt of the start signal from the start signal generator 57, wherein the delay time is a predetermined constant value. After clocking the delay time T min, the delay circuit 58 outputs a start signal to the counter circuit 59. Then the counter circuit 59 starts time-counting by a unit time "t0" that is shorter than a clock interval of the delay circuit 5. Thus, the counter circuit 59 counts a second discharge time following the delay time, with higher accuracy than the delay circuit 58. The voltage at the non-inverting input of the comparator 55 decreases as the capacitor 50 is discharged. When the voltage at the non-inverting input of the comparator 55 comes to be equal to the reference voltage Vref, the comparator 55 outputs a stop signal to the counter circuit 59. Thus, the reference voltage Vref of the comparator 55 may be called a discharge stop voltage. Then the counter circuit 59 stops counting, and outputs a count Q to the resistance calculator 60.

Figure 6:
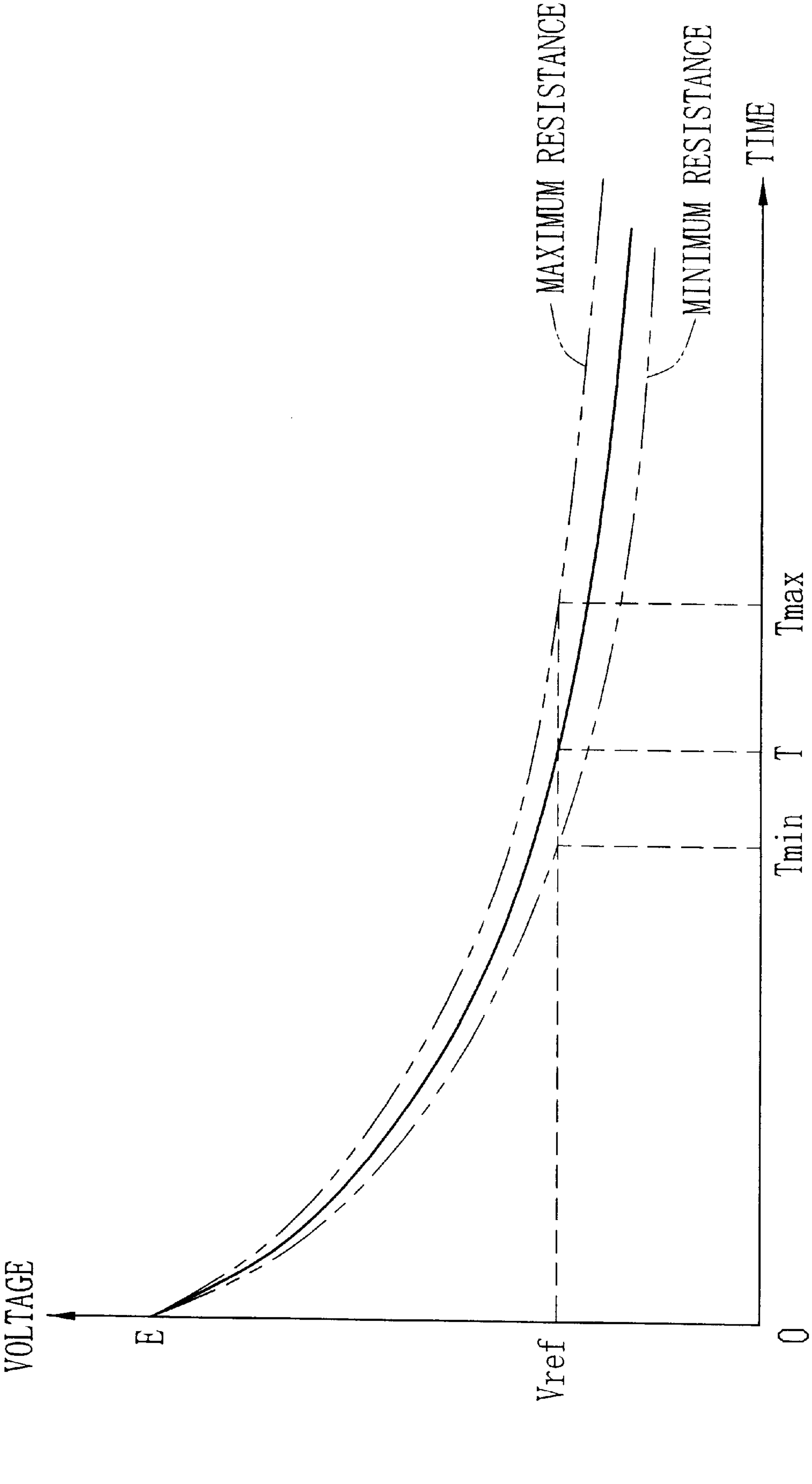
FIG. 6 is a graph showing a relationship between charge voltage and discharge time of a capacitor.

The delay time is equal to a minimum discharge time T min that is required to discharge the fully charged capacitor 50 through one of the heating elements 49*a* to 49*n* whose resistance is the smallest, till the voltage at the non-inverting input of the comparator 55 decreases from the level E to the discharge stop voltage Vref, as shown in FIG. 6. In practice, the delay time is determined to be slightly less than the minimum discharge time T min, but the present embodiment will be described on the assumption that the delay time is T min. On the other hand, a maximum discharge time T max is necessary for discharging the fully charged capacitor 50 through one of the heating elements 49*a* to 49*n* whose resistance is the largest, till the voltage at the non-inverting input of the comparator 55 decreases to the discharge stop voltage Vref. Consequently, any of discharge times through the heating elements Ra to Rn is included in a range from the minimum discharge time T min to the maximum discharge time T max. It is to be noted that the minimum and maximum discharge times T min and T max are experimentally determined based on measurement values that are obtained from several thermal heads, called sample thermal heads.

Assuming that T max, C max, R max, Vref max and E max represent respective maximum values of the discharge time T, the capacitance C of the capacitor 50, the resistance R of the heating elements, the discharge stop voltage Vref and the discharge start voltage E, and T min, C min, R min, Vref min and E min represent respective minimum values thereof, the maximum discharge time T max and the minimum discharge time T min may be given as follows, in accordance with the equation (4) that is mentioned in the description of the prior art:

$$T\ \max=-C\ \max\cdot R\ \max\cdot\ln(Vref\ \max/E\ \max) \quad (5)$$

$$T\ \min=-C\ \min\cdot R\ \min\cdot\ln(Vref\ \min/E\ \min) \quad (6)$$

Assuming that the counter circuit 59 needs 16 bits for sufficiently accurate measurement, the unit time t0 is determined by the maximum and minimum discharge time T max and T min according to the following equation:

$$t0=(T\ \max-T\ \min)/2^{16} \quad (7)$$

According to the present embodiment, the values T max, C max, R max, Vref max, E max T min, C min, R min, Vref min and E min are known, and the unit time t0 is 0.1 second, whereas the clock interval of the delay circuit 58 is 5 seconds.

The resistance calculator 60 calculates the second discharge time by multiplying the unit time to by the count Q, and then calculates the discharge time T by adding the second discharge time to the first or minimum discharge time T min. Concretely, the resistance calculator 60 calculates the discharge time T according to the following equation:

$$T=T\ \min+t0\cdot Q \quad (8)$$

Based on this discharge time T, the resistance calculator 60 calculates the resistance R of the individual heating elements, according to the above mentioned equation (3). Therefore, the discharge time Ts through the reference resistor 64 is first detected in the above described manner when the thermosensitive color printer is initially set up. The obtained resistance R is written in RAM 43*b*. A backup battery 56 is provided in the microcomputer 43 for backing up the data written in the RAM 43*b*.

Figure 7:
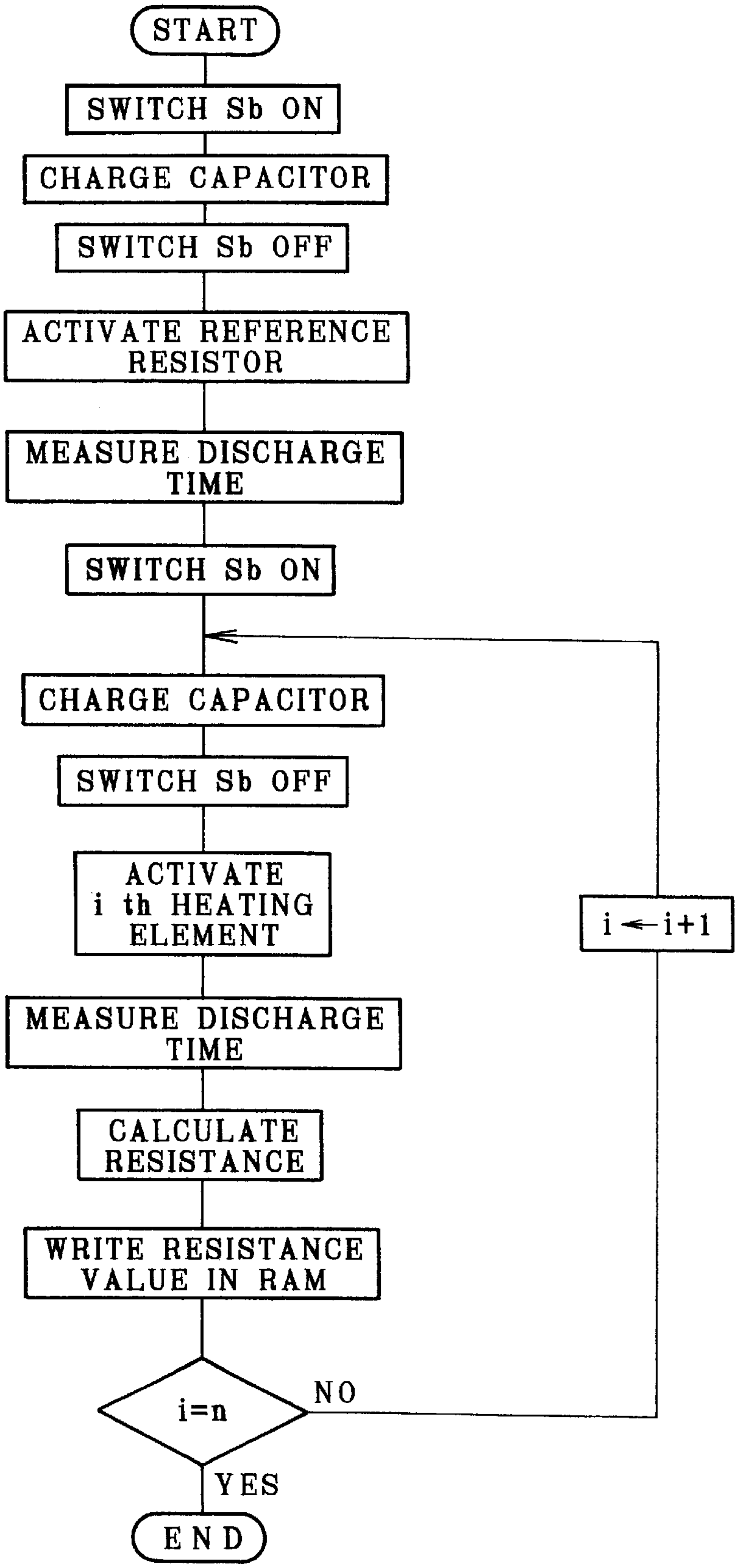
FIG. 7 is a flowchart of a resistance measuring mode of the thermosensitive color printer.

Now the overall operation of the thermosensitive color printer of the present embodiment will be described with reference to FIG. 7.

During the initial setup operation, the printer is switched to the resistance measuring mode through the first switch Sa, so the shift register 44 is connected to the microcomputer 43. The microcomputer 43 outputs such control data that turns the reference transistor 65 ON and other transistors 48*a* to 48*n* OFF, and turns the second switch Sb ON to start charging the capacitor 50. After the voltage charged in the capacitor 50 reaches the value E, the start signal generator 57 of the resistance measuring section 43*a* outputs the start signal to the second switch Sb and the delay circuit 58. Upon the start signal, the second switch Sb is turned OFF, so the capacitor 50 starts being discharged through the reference resistor 64, and the voltage at the non-inverting input of the comparator 55 begins to decrease. Simultaneously, upon the start signal, the delay circuit 58 starts clocking the minimum discharge time T min at the relatively long clock interval. When the minimum discharge time T min has elapsed from the start of discharging, the counter circuit 59 starts time-counting by the unit time t0 that is remarkably shorter than the clock interval of the delay circuit 58. When the voltage at the non-inverting of the comparator 55 reaches the discharge stop voltage Vref, the counter circuit 59 stops counting and outputs a count Qs to the resistance calculator 60. Thus, a discharge time Ts through the reference resistor 64 is calculated based on the count Qs according to the equation (8).

Next, the microcomputer 43 outputs control data that turns the transistor 48*a* ON and other transistors 48*b* to 48*n* and the reference transistor 65 OFF. In this condition, the capacitor 50 is charged by turning the second switch Sb ON. When the voltage at the non-inverting input of the comparator 55 reaches the level E, the second switch Sb is turned OFF to start discharging the capacitor 50 through the first heating element 49*a*. After the minimum discharge time T min is clocked by the delay circuit 58, the counter circuit 59 counts the second discharge time till the voltage at the non-inverting input of the comparator 55 reaches the discharge stop voltage Vref. Based on a count Q1 obtained in this way the resistance calculator 60 calculates a discharge time Ta through the first heating element 49*a* according to the equation (8), and calculates resistance R1 of the first heating element 49*a* according to the equation (3). The resistance R1 is written in the RAM 43*b*.

Thereafter, the transistor 48*b* is turned ON and other transistors 48*a*, 48*c* to 48*n* are turned OFF. The resistance measuring section 43*a* then measures a discharge time Tb of the capacitor 50 through the second heating element 49*b*, and calculates resistance R2 of the second heating element 49*b* based on the discharge time Tb, in the same way as for the first heating element 49*a*. The resistance R2 is written in the RAM 43*b*. In this way, resistance values R1 to Rn of the heating elements 49*a* to 49*n* are sequentially measured and written in the RAM 43*b*. These resistance values R1 to Rn are stored till the backup battery 56 runs down.

To set the-print mode, the first switch Sa is switched over to connect the shift register 44 to the comparator 42. In the print mode, first the image data of a frame of full color image is written in the frame memory 40 separately for each color. Then, the image data is corrected by using correction data which is calculated for each heating element based on a difference between the actual resistance value thereof, which has been measured and written in the RAM 43*b* in the resistance measuring mode, and an ideal resistance value that is common to all the heating elements 49*a* to 49*n*. Because of this correction, the pixel s can be correctly recorded even through the actual resistance values R1 to Rn of the heating elements 49*a* to 49*n* are not uniform and different from the ideal value.

The platen drum 10 initially stays in a position where the clamp member 12 is placed at the exit of the paper passageway 27 with its arm portions oriented vertically in FIG. 1. When the solenoid 18 is turned ON, the clamp member 12 is set to a clamp release position where the clam portion thereof is removed off the platen drum 10. The feed rollers 28 nip and feed the thermosensitive color recording paper 11 toward the platen drum 10. The feed rollers 28 stop rotating when the leading end of the thermosensitive color recording paper 11 is placed between the platen drum 10 and the clamp member 12. Thereafter when the solenoid 18 is turned OFF, the clamp member 12 is returned to the initial position according to the act of the spring 17, thereby clamping the leading end of the thermosensitive color recording paper 11. After clamping the thermosensitive color recording paper 11, the platen drum 10 and the feed rollers 28 start rotating, so that the thermosensitive color recording paper 11 is wound on the outer periphery of the platen drum 10.

The platen drum 10 is rotated intermittently by a predetermined step. When a leading edge of a recording area of the thermosensitive color recording paper 11 reaches the thermal head 20, first the recording of a yellow frame of the full-color image is started. During the yellow frame recording, the image data of one line of the yellow frame are read out from the frame memory 40, and are temporarily written in the line memory 41.

Then, the image data are read out from the line memory 41, and are sent to the comparator 42 wherein the image data is compared with the first gradation data representative of the lowest density “0”. The comparator 42 outputs a high level signal “H” for a pixel to be recorded as a yellow dot, and outputs a signal “L” for such a pixel to have no yellow dot. The results of comparison are sent to the shift register 44 in the form of serial drive data. The serial drive data is shifted by the clock signal in the shift register 44 so as to be converted into parallel drive data. The parallel drive data is latched in the latch array 45 and then sent to the AND gate array 46.

At that time, the microcomputer 43 outputs a bias heating pulse having a relatively large width as a first strobe signal to the AND gate array 46. Because the AND gate array 46 outputs logical products of the strobe signal and the respective output signals of the latch array 45, high level signals “H” appear on those outputs of the AND gate array 46 which correspond to the outputs of the latch array 45 having the high level signals “H”. For example, if the first output of the AND gate array 46 takes the high level, the first transistor 48*a* is turned ON, so that the first heating element 49*a* are activated for a time period corresponding to the width of the bias heating pulse. As a result, a predetermined amount of bias heat energy is applied to the thermosensitive color recording paper 11.

Before the end of the bias heating, the microcomputer 43 outputs the gradation data “1” to the comparator 42. The image data of each pixel is compared with the gradation data “1”. As a result of comparison, a serial drive data is produced and written in the shift register 44. When the bias heating is complete, the microcomputer 43 generates a gradation pulse having a width less than that of the bias heating pulse. The gradation pulse is applied as a subsequent strobe signal to the AND gate array 46. In response to this strobe pulse, some of the heating elements 49*a* to 49*n* are activated in accordance with the drive data for a shorter time corresponding to the width of the gradation pulse, causing the yellow coloring layer 35 to develop yellow dots at a density corresponding to the tonal level “1”.

Thereafter, similar process is repeatedly carried out for recording the first line of the yellow frame on the yellow recording layer 35 until the microcomputer 43 has generated the last gradation data “3F” corresponding to the maximum density. In this way, the heating elements 49*a* to 49*n* are selectively driven in accordance with the corrected image data of the first line of the yellow frame, while a single bias heating pulse and, thereafter, 1 to 64 gradation pulses are applied to as the strobe signals to the AND gate array 46. Thus, for recording a pixel at the maximum density, 64 pulse currents are conducted through the corresponding heating element. In this way, a line of yellow pixels are recorded at densities of 64 tonal levels.

After the recording of the first line of the yellow frame is complete, the platen drum 10 is rotated by an amount corresponding to one pixel. Simultaneously, the image data of the second line of the yellow frame are read out from the frame memory 40. Thereafter, the same procedure as above is repeated for recording the second and the following lines of the yellow frame. When the part of the recording paper 11 on which the yellow frame is recorded in moved under the optical fixing device 21, the ultraviolet lamp 23 of the optical fixing device 21 is driven for fixing the yellow coloring layer 35. At that time, the sharp-cut filter 24 is placed in front of the ultraviolet lamp 23. So the near ultraviolet rays of about 420 nm is projected onto the thermosensitive color recording paper 11, decomposing the diazonium salt compound that remains in the yellow coloring layer 35.

When the platen drum 10 makes one revolution to place the leading edge of the recording area again under the thermal head 20, a magenta frame of the full-color image begins to be recorded line by line. Although the heat energy applied for coloring the magenta coloring layer 34 is larger than that for the yellow coloring layer 35, since the yellow coloring layer 35 is optically fixed, it does not affect the yellow coloring layer 35. For fixing the magenta coloring layer, the sharp-cut filter 24 is displaced from the front of the ultraviolet lamp 23, so that the thermosensitive color recording paper 11 is exposed to all the electromagnetic rays radiated from the ultraviolet lamp 23. Among of these electromagnetic rays, ultraviolet rays of about 365 nm fix the magenta coloring layer 34.

When the platen drum 10 makes another revolution to place the recording area under the thermal head 20 once again, recording of a,cyan frame of the full-color image begins line by line on the cyan recording layer 33. Because the heat energy necessary for coloring the cyan recording layer 33 has such a large value that the heat energy cannot be applied to the thermosensitive color recording paper 11 under normal conditions of preservation. Therefore, can recording layer 33 is not given a capacity of being optically fixed. For this reason, the optical fixing device 21 is turned OFF during the cyan frame recording. However, it is possible to turn on the optical fixing device 21 to bleach blank portions of the thermosensitive color recording paper 11.

After the three color frames of the full-color image is recorded, the platen drum 10 and the feed rollers 28 are rotated reversely. Thereby, the trailing end of the thermosensitive color recording paper 11 is guided by the separation claw 29 into the paper passageway 27, and is nipped by the feed rollers 28. Thereafter when the platen drum 10 reaches the initial position at which the clamp member 12 is placed at the exit of the paper passageway 27, the platen drum 10 stops rotating, and the solenoid 18 is turned on simultaneously. Thus, the clamp member 12 is moved to the clamp release position against the act of the spring 17, releasing the leading end of the thermosensitive color recording paper 11, so that the thermosensitive color recording paper 11 is ejected from the platen drum 10 through the paper passageway 27.

Because the resistance values R1 to Rn of the heating elements 49*a* to 49*n* vary with age and depending upon the frequency of printing, it is preferable to measure the resistance values R1 to Rn and rewrite the RAM 43*b* with the newly detected resistance values R1 to Rn each time the thermosensitive color print is set up. It is possible to omit the backup battery 56, and supply power to the RAM 43*b* from the power supply section 51. It is also possible to replace the RAM 43*b* with a flash memory or another kind of memory that does not need a backup power source.

In the present embodiment, a 16 bit counter is used for counting the second discharge time, but the bit number of the counter is not limited to this value. For example, a 32 bit counter may be used. The delay time, for which the timing of starting counting the discharge time by the counter circuit 59 is delayed from the start of discharging, is equal to the minimum discharge time in the above embodiment. However, the delay time may be less than the minimum discharge time insofar as the second discharge time is within a range countable with the limited bit number of the counter circuit.

Although the capacitor 50 starts being discharged after it is fully charged in the above embodiment, the discharge start voltage E may be less than the level corresponding to the fully charged capacitor insofar as it is higher than the discharge stop voltage Vref. Setting the discharge start voltage at a lower level contributes to saving time for measuring the discharge time and thus the resistance values.

Now, another embodiment of the present invention will be described with reference to FIGS. 8 and 9, that does not use a delay circuit. Other fundamental structures of the second embodiment are equivalent to those of the first embodiment as shown in FIGS. 1 to 4, so that the following description relates only to those features essential for the second embodiment.

According to the above equation (4), the discharge start voltage E may be given as follows:

$$E=Vref/\exp\{-T/(C\cdot R)\} \quad (9)$$

Once a capacitor 50, a power source section 51 and a comparator 55 are fixed as concrete parts, the capacitance C (≦C max) of the capacitor 50, the discharge start voltage E (E min≦E≦E max) and the discharge stop voltage Vref (Vref min≦Vref≦Vref max) do not vary so largely, regardless of their temperature characteristics. Also a maximum value R max and a minimum value R min of resistances R of heating elements may be determined according to their designs and dimensions. Because the discharge time T (T min≦T≦T max) becomes the largest when the discharge start voltage E, the capacitance C and the resistance R have their maximum values and the discharge stop voltage Vref is the smallest, a maximum discharge start voltage E max may be given as follows:

$$E\ \max=Vref\ \min/\exp\{-T\ \max/(C\ \max\cdot R\ \max)\} \quad (10)$$

In the second embodiment, the maximum discharge start voltage E max is determined by substituting a longest countable time of a counter circuit 59 for T max in the equation (10), wherein the longest countable time limit is an overflow limit determined by the bit number of the counter circuit 59. Then, a first discharge start voltage E1 is predetermined to be less than this maximum discharge start voltage E max, taking account of the tolerance, so that the counter circuit 59 will not overflow. Then, after charging the capacitor 50 up to the first discharge start voltage E1, a first reference discharge time Ts1 through a reference resistor 64*a* is measured till the voltage at a non-inverting input of a comparator 55 decreases to the discharge stop voltage Vref. The relationship between the discharge start voltage E1 and the first reference discharge time Ts1 may be given as follows, in accordance with the above equation (9):

$$E1=Vref/\exp\{-Ts1/(C\cdot Rs)\} \quad (11)$$

Figure 8:
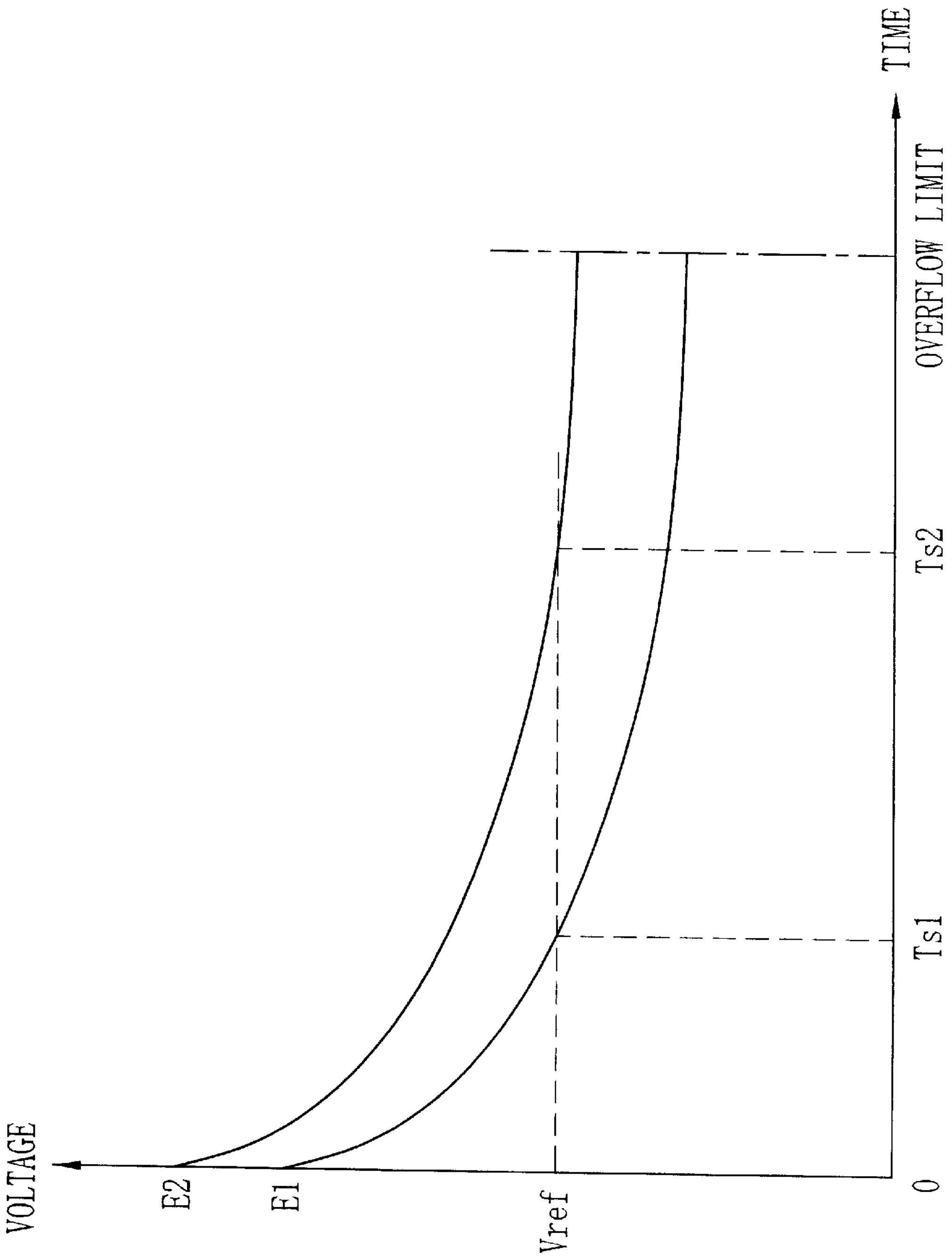
FIG. 8 is a graph showing a relationship between charge voltage and discharge time of a capacitor according to a second embodiment of e present invention.
Figure 9:
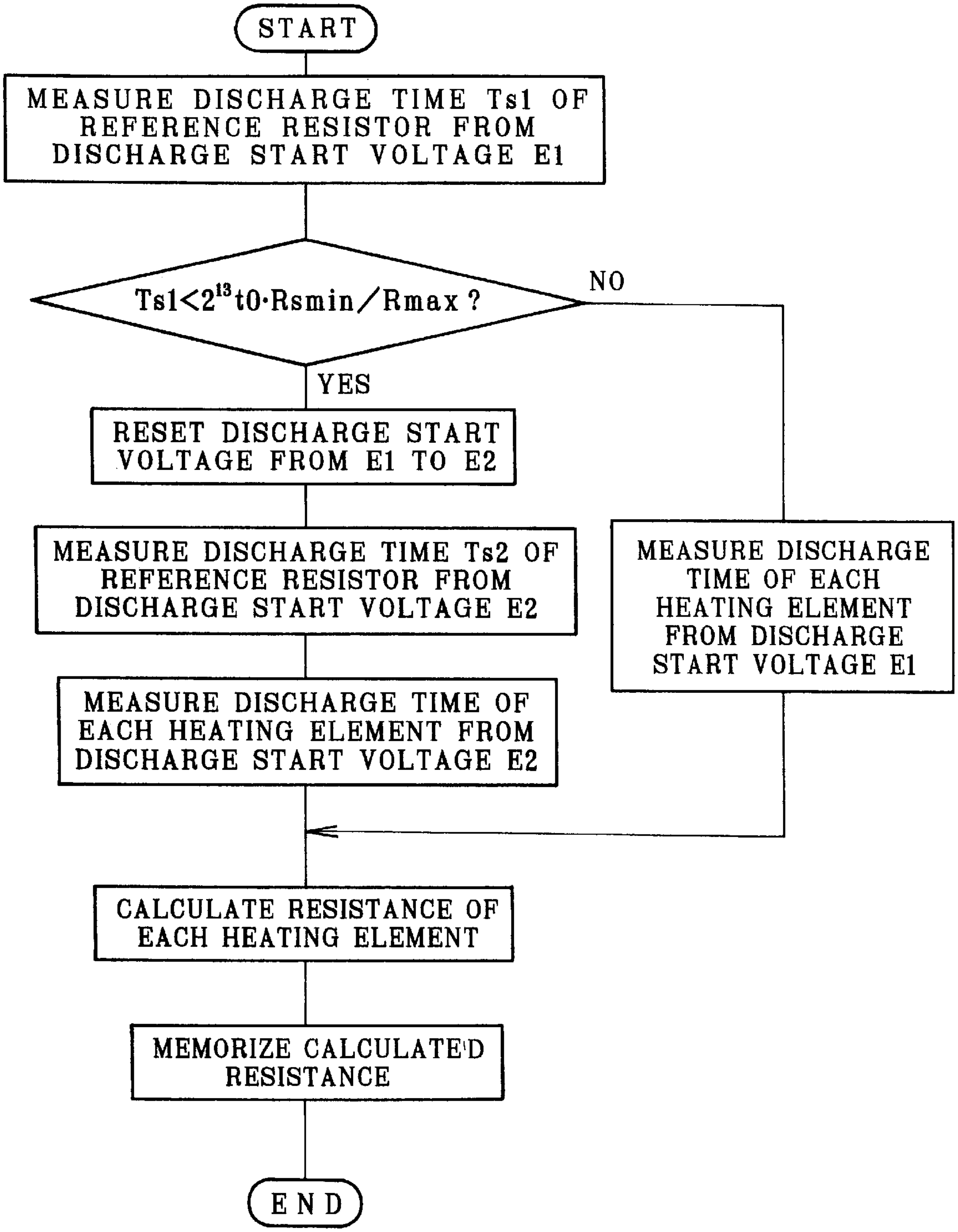
FIG. 9 is a flowchart of a resistance measuring mode according to the second embodiment of the present invention.

If the count value of the counter circuit 59 for the first reference discharge time Ts1 is too small with respect to the bit number or countable range of the counter circuit 59, a higher second discharge start voltage E2 than the first discharge start voltage E1 is determined such that the counter circuit 59 would not overflow by counting a longer discharge time Ts2 that is required to discharge the capacitor 50 from the second discharge start voltage E2 to the discharge stop voltage Vref through the reference resistor, as is shown in FIG. 8. To prevent the counter circuit 59 from overflowing, the discharge time Ts2 should not be more than a value T2 that is determined according to the following equation:

$$T2=(2^N-1)\cdot t0\cdot Rs\ \min/R\ \max \quad (12)$$

wherein N represents the bit number of the counter circuit 59, and t0 represents a unit time of the counter circuit 59.

Where the bit number N of the counter circuit 59 is "16", the discharge time T2 is given as follows:

$$T2=(2^{16}-1)\cdot t0\cdot Rs\ \min/R\ \max \quad (13)$$

In this embodiment, if the count value for the first reference discharge time Ts1 has effective digits of less than 13 bits while the counter circuit 59 is a 16-bit counter, the count value for the first reference discharge time Ts1 is judged to be too small with respect to the capacity of the counter circuit 59. That is, the first discharge start voltage E1 is judged to be insufficient when the value Ts1 satisfies the following condition:

$$Ts1<2^{13}t0\cdot Rs\ \min/R\ \max \quad (14)$$

Then, the second discharge start voltage E2 is determined by the discharge time T2 in accordance with the above equation (9):

$$E2=Vref/\exp\{-T2/(C\cdot Rs)\} \quad (15)$$

Combining the above equations (11) and (15) provides the following equation:

$$E2=Vref/\exp\{(T2/Ts1)\cdot\ln(Vref/E1)\} \quad (16)$$

In practice, however, the counter circuit 59 can overflow even where the second discharge voltage E2 is determined according to the equation (16) if there is a setup error toward the pulse side in the discharge start voltage E2. For this reason, the second discharge start voltage E2 is determined by multiplying the right side member of the equation (16)

with a coefficient K considering a voltage setup tolerance ($K \leqq 1.0$):

$$E2 = K \cdot Vref / \exp\{(T2/Ts1) \cdot \ln(Vref/E1)\} \quad (17)$$

Thereafter, a discharge time Ts2 is measured while discharging the capacitor 50 through the reference resistor 64 from the second discharge start voltage E2 to the discharge stop voltage Vref.

Thus, depending upon the judgement with the condition (14), the counter circuit 59 counts discharge time through each of the heating elements 49$a$ to 49$n$ from the first discharge start voltage E1 or the second discharge start voltage E2 to the discharge stop voltage Vref. Based on the obtained discharge time Ta to Tn, the resistance calculator 60 calculates resistance R1 to Rn of each of the heating elements 49$a$ to 49$n$ in accordance with the above equation (3). That is, where the discharge time T is measured from the second discharge start voltage E2, the resistance R is calculated according to the equation:

$$R = Rs \cdot T/Ts2 \quad (18)$$

Where the discharge time T is measured from the first discharge start voltage E1, the resistance R is calculated according to the equation:

$$R = Rs \cdot T/Ts1 \quad (19)$$

The operation of the second embodiment will now be briefly described with reference to FIG. 9.

During the initial setup operation, the printer is switched to the resistance measuring mode through a first switch Sa, so a shift register 44 is connected to a microcomputer 43. The microcomputer 43 turns the reference transistor 65 ON and other transistors 48$a$ to 48$n$ OFF, and turns the second switch Sb ON to start charging the capacitor 50. After the voltage charged in the capacitor 50 reaches the predetermined discharge start voltage E1, the second switch Sb is turned OFF to start discharging the capacitor 50 through the reference resistor 64 and, at the same time, the counter circuit 59 starts time-counting by the unit time t0. When the voltage at the non-inverting of the comparator 55 reaches the discharge stop voltage Vref, the counter circuit 59 stops counting and outputs a count Qs1 to the resistance calculator 60. Thus, the first reference discharge time Ts1 through the reference resistor 64 is calculated by multiplying the unit time t0 with the count Qs1.

If the first reference discharge time Ts1 satisfies the condition (14), a second discharge start voltage E2 is determined in accordance with the above equations (13) and (17). Then, the microcomputer 43 turns the second switch Sb ON to start charging the capacitor 50 while maintaining the reference transistor 65 ON and other transistors 48$a$ *to* 48$n$ OFF. When the voltage charged in the capacitor 50 reaches the second discharge start voltage E2, the second switch Sb is turned OFF to start discharging the capacitor 50 through the reference resistor 64 and, at the same time, the counter circuit 59 starts time-counting by the unit time t0. When the voltage at the non-inverting of the comparator 55 reaches the discharge stop voltage Vref, the counter circuit 59 stops counting and outputs a count Qs2 to the resistance calculator 60. Thus, a discharge time Ts2 through the reference resistor 64 is calculated by multiplying the unit time t0 with the count Qs2.

Next, the microcomputer 43 turns the transistor 48$a$ ON and other transistors 48$b$ to 48$n$ and the reference transistor 65 OFF. In this condition, the capacitor 50 is charged by turning the second switch Sb ON.

In case the second discharge start voltage E2 is determined, the second switch Sb is turned OFF when the voltage at the non-inverting input of the comparator 55 reaches the level E2, to start discharging the capacitor 50 through the first heating element 49$a$. Simultaneously, the counter circuit 59 starts time-counting till the voltage at the non-inverting input of the comparator 55 reaches the discharge stop voltage Vref. Based on a count Q1 obtained in this way the resistance calculator 60 calculates a discharge time Ta through the first heating element 49$a$ by multiplying the unit time t0 with the count Q1, and calculates resistance R1 of the first heating element 49$a$ by substituting the value Ta for T in the equation (18): R=Rs·T/Ts2.

In case the first reference discharge time Ts1 does not satisfies the above condition (14), the second switch Sb is turned OFF to start discharging the capacitor 50 when the voltage at the non-inverting input of the comparator 55 reaches the level E1, so the counter circuit 59 counts a discharge time Ta through the first heating element 49$a$ from the first discharge start voltage E1 to the discharge stop voltage Vref. Then, resistance R1 of the first heating element 49$a$ is calculated by substituting the value Ta for T in the equation (19): R=Rs·T/Ts1.

The calculated resistance R1 is written in a RAM 43$b$. Thereafter, the transistor 48$b$ is turned ON and other transistors 48$a$, 48$c$ to 48$n$ are turned OFF. The resistance measuring section 43$a$ then measures a discharge time Tb of the capacitor 50 through the second heating element 49$b$ based on the first discharge start voltage E1 or the second discharge start voltage E2, and calculates resistance R2 of the second heating element 49$b$ based on the discharge time Tb, in the same way as for the first heating element 49$a$.

In this way, resistance values R1 to Rn of the heating elements 49$a$ to 49$n$ are sequentially measured and written in the RAM 43$b$. These resistance values R1 to Rn are stored till the backup battery 56 runs down. Based on these resistance values R1 to Rn, image data is corrected so as to compensate for variations between the resistance values R1 to Rn.

Although the second discharge start voltage E2 is used after the first reference discharge time Ts1 from the first discharge start voltage E1 through the reference resistor is measured and judged to be inefficient in view of the capacity of the counter circuit, it is possible to skip the above judging process, and use the higher discharge start voltage, that is determined according to the equation (17), for the resistance measurement of the heating elements in any cases.

Furthermore, it is possible to charge the capacitor before one of the heating elements or the reference resistor is turned on, and discharge it by turning one of the heating elements or the reference resistor ON, though the capacitor starts being charged after one of the heating elements or the reference resistor is turned on in the above embodiment.

It is also possible to separate the above function or device of measuring resistance of the heating elements of the thermal head from the printer.

Although the present invention has been described so far with reference to the embodiments applied to the thermosensitive color printer, the present invention is applicable to any kinds of thermal printers, including monochromatic thermosensitive printers and thermal transfer type color printers. The present invention is applicable not only to line printers that record an image line by line as set forth above, but also serial printers whose thermal head is moved both the main scan direction and the sub scan direction relative to the recording medium, insofar as the thermal head has a plurality of heating elements.

Thus, the present invention is not to be limited to the above embodiments but, on the contrary, various modifications will be possible to those skilled in the art without departing from the scope of claims appended hereto.

What is claimed is:

1. A method for measuring resistance of each individual heating elements of a thermal head, said heating elements being connected in parallel to one another, the method comprising the steps of:

charging a capacitor up to a first voltage level, said capacitor being connected in parallel with said heating elements;

discharging said capacitor from said first voltage level to a second voltage level through one said heating element whose resistance is to be measured;

starting counting discharge time after a predetermined delay time from the start of discharging said capacitor through said one heating element;

calculating a discharge time of said capacitor from said first voltage level to said second voltage level based on said delay time and a count obtained by said counting; and calculating a resistance value of said one heating element based on said calculated discharge time.

2. A method of measuring resistance as recited in claim 1, wherein said delay time is equal to or slightly less than a shortest discharge time required to discharge said capacitor from said first voltage level to said second voltage level through one heating element having a smallest resistance among said heating elements.

3. A method of measuring resistance as recited in claim 2, wherein said delay time is clocked at a longer interval than a unit time of said counting.

4. A method of measuring resistance as recited in claim 3, wherein said unit time of said counting is determined according to the following formula:

$$t0=(T\ \max-T\ \min)/2^N$$

wherein t0 represents said unit time, T max represents a longest discharge time required to discharge said capacitor from said first voltage level to said second voltage level through one heating element having a largest resistance among said heating elements, T min represents said shortest discharge time, and N represents a bit number of a counter used for said counting.

5. A method of measuring resistance as recited in claim 4, further comprising the following steps before the steps of claim 1:

charging said capacitor up to said first voltage level;

discharging said capacitor from said first voltage level to said second voltage level through a reference resistor having a known resistance;

starting counting discharge time of said capacitor through said reference resistor after said predetermined delay time from the start of discharging; and calculating a reference discharge time based on said delay time and a count obtained by said counting, wherein said resistance value of said one heating element is calculated based on said reference discharge time, said known resistance and said discharge time.

6. A method of measuring resistance as recited in claim 1, wherein said predetermined delay time is fixed.

7. A method of measuring resistance as recited in claim 1, wherein said discharging of said capacitor from said first voltage level to said second voltage level is not a complete discharge of the capacitor.

8. A method of measuring resistance as recited in claim 1, wherein said counter has at most 16 bits and a unit of time of said counter at most 0.1 seconds.

9. A method for measuring resistance of each individual heating elements of a thermal head by measuring discharge time of a capacitor through each of said heating elements, said heating elements and said capacitor being connected in parallel to one another, the method comprising the steps of:

measuring a first reference discharge time of said capacitor from a first discharge start voltage to a discharge stop voltage through a reference resistor having a known resistance, by counting with a counter;

judging whether said first reference discharge time satisfies a condition that is determined based on a bit number and a unit time of said counter;

determining, if said first reference discharge time satisfies said condition, a second discharge start voltage that is higher than said first discharge start voltage by a degree that said counter would not overflow;

measuring discharge time of said capacitor from said second discharge start voltage to said discharge stop voltage sequentially through said reference resistor and each of said heating elements;

measuring, if said first reference discharge time does not satisfy said condition, discharge time of said capacitor from said first discharge start voltage to said discharge stop voltage sequentially through each of said heating elements; and calculating respective resistance values of said heating elements based on said measured discharge times through said reference resistor and each of said heating elements.

10. A method of measuring resistance as recited in claim 9, wherein said first discharge start voltage is determined to be less than a maximum discharge start voltage E max by an amount considering a tolerance, said maximum discharge start voltage E max being given as follows:

$$E\ \max=Vref\ \min/\exp\{-T\ \max/(C\ \max\cdot R\ \max)\}$$

wherein Vref min represents a minimum value of said discharge stop voltage, T max a longest countable time of said counter, C max a maximum capacitance of said capacitor and R max a maximum resistance of said heating elements.

11. A method of measuring resistance as recited in claim 10, wherein said condition relating to said first reference discharge time Ts1 is given as follows:

$$Ts1<2^{N-2}t0\cdot Rs\ \min/R\ \max.$$

wherein N and t0 respectively represent the bit number and said unit time of said counter, Rs min represents a minimum resistance of said reference resistor, and R max represents a maximum resistance of said heating elements.

12. A method of measuring resistance as recited in claim 11, wherein said second discharge start voltage is determined such that a discharge time T2 of said capacitor from said second discharge start voltage to said discharge stop voltage through any of said heating elements satisfies the following condition:

$$T2=(2^N-1)\cdot t0\cdot Rs\ \min/R\ \max.$$

13. A method of measuring resistance as recited in claim 12, wherein said second discharge start voltage E2 is determined based on said first reference discharge time Ts1 taken to discharge said capacitor through said reference resistor from said first discharge start voltage E1 to said discharge stop voltage Vref, according to the following equation:

$$E2 = K \cdot Vref / \exp\{(T2/Ts1) \cdot \ln(Vref/E1)\}$$

wherein K a coefficient considering a voltage setup tolerance.

14. A method for measuring resistance of each individual heating elements of a thermal head by measuring discharge time of a capacitor through each of said heating elements, said heating elements and said capacitor being connected in parallel to one another, the method comprising the steps of:

measuring a first reference discharge time of said capacitor from a first discharge start voltage to a discharge stop voltage through a reference resistor having a known resistance, by counting with a counter;

determining a higher second discharge start voltage than said first discharge voltage based on said first discharge start voltage and said first reference discharge time;

measuring discharge time of said capacitor from said second discharge start voltage to said discharge stop voltage sequentially through said reference resistor and each of said heating elements; and calculating respective resistance values of said heating elements based on said measured discharge times through each of said heating elements and said reference resistor.

15. A method of measuring resistance as recited in claim 14, wherein said second discharge start voltage E2 is determined according to the following equation:

$$E2 = K \cdot Vref / \exp\{(T2/Ts1) \cdot \ln(Vref/E1)\}$$

wherein E1 represents said first discharge start voltage, Ts1 said first reference discharge time, Vref said discharge stop voltage, K a coefficient considering a voltage setup tolerance, and T2 represents a discharge time determined according to the following equation:

$$T2 = (2^N - 1) \cdot t0 \cdot Rs\ \min / R\ \max$$

wherein N and t0 respectively represent the bit number and said unit time of said counter, Rs min represents a minimum resistance of the reference resistor, and R max represents a maximum resistance of said heating elements.

16. A method of measuring resistance as recited in claim 15, wherein said first discharge start voltage is determined to be less than a maximum discharge start voltage E max by an amount considering a tolerance, said maximum discharge start voltage E max being given as follows:

$$E\ \max = Vref\ \min / \exp\{-T\ \max / (C\ \max \cdot R\ \max)\}$$

wherein Vref min represent a minimum value of said discharge stop voltage, T max a longest countable time of said counter, C max a maximum capacitance of said capacitor and R max a maximum resistance of said heating elements.

17. A resistance measuring device for a thermal head having an array of parallel connected heating elements which are heated by a voltage supplied from a power supply section, and transistors connected in series to said heating elements in one to one relation, the resistance measuring device comprising:

a capacitor connected to said power supply circuit in parallel with said heating elements;

a switch connected between said power supply section and said capacitor to connect or disconnect said capacitor and said heating elements to or from said power supply section;

a control device for turning said switch ON to charge said capacitor up to a first voltage level, and then turning said switch OFF to discharge said capacitor through one of said heating elements while setting a corresponding one of said transistors ON;

a delay circuit that starts clocking a predetermined delay time with the start of discharging said capacitor;

a counter that starts time-counting when said delay circuit finishes clocking said delay time, and stops counting when voltage charged in said capacitor reaches a second voltage level, said counter counting by a unit time that is shorter than a clock interval of said delay circuit; and a calculation device for calculating a resistance value of said one heating element based on a discharge time determined by adding said delay time to a time obtained by multiplying said unit time by a count of said counter.

18. A resistance measuring device as recited in claim 17, wherein said delay time is equal to or slightly less than a shortest discharge time required to discharge said capacitor from said first voltage level to said second voltage level through one heating element having a smallest resistance among said heating elements.

19. A resistance measuring device as recited in claim 18, further comprising:

a reference resistor having a known resistance and being connected in parallel to said heating elements; and a transistor connected in series to said reference resistor, said transistor being turned ON and OFF by said control device, wherein said calculating device calculates said resistance value of said one heating element on the basis of said discharge time measured in relation to said one heating element and a reference discharge time measured in relation to said reference resistor.

20. A resistance measuring device for a thermal head having an array of parallel connected heating elements which are heated by a voltage supplied from a power supply section, and transistors connected in series to said heating elements in one to one relation, the resistance measuring device comprising:

a capacitor connected to said power supply circuit in parallel with said heating elements;

a reference resistor having a known resistance and being connected in parallel to said heating elements;

a transistor connected in series to said reference resistor;

a switch connected between said power supply section and said capacitor to connect or disconnect said capacitor and said heating elements to or from said power supply section;

a control device for turning said switch ON to charge said capacitor and then turning said switch OFF to discharge said capacitor through one of said heating elements and said reference resistor while setting a corresponding one of said transistors ON;

a counter for measuring discharge time of said capacitor from the start of discharging till charged voltage in said capacitor reaches a predetermined discharge stop voltage;

a judging device for judging whether a first reference discharge time is less than a comparative value that is determined based on a bit number and a unit time of said counter, said first reference discharge time being measured by discharging said capacitor through said reference resistor from a predetermined first discharge start voltage to said discharge stop voltage;

a discharge start voltage determining device for determining a second discharge start voltage based on said first reference discharge time and said first discharge start voltage if said first reference discharge time is less than said comparative value; and a calculation device for calculating a resistance value of said one heating element on the basis of discharge times measured relating to said reference resistor and said one heating element from said second discharge start voltage after said second discharge start voltage is determined, or on the basis of said first reference discharge time and a discharge time measured relating to said one heating element from said first discharge start voltage if said first reference discharge time is not less than said comparative value.

* * * * *

UNITED STATES PATENT AND TRADEMARK OFFICE

CERTIFICATE OF CORRECTION

PATENT NO. : 6,531,883 B2
DATED : March 11, 2003
INVENTOR(S) : Junji Hayashi

It is certified that error appears in the above-identified patent and that said Letters Patent is hereby corrected as shown below:

Title page,
Item [30] should read:
-- [30] Foreign Application Priority Data
December 7, 1999 (JP) ............................................ 11-348212
December 7, 1999 (JP) ............................................ 11-348213 --

Signed and Sealed this

Fifth Day of August, 2003

JAMES E. ROGAN
*Director of the United States Patent and Trademark Office*